(12) United States Patent
Maldonado et al.

(10) Patent No.: US 7,161,162 B2
(45) Date of Patent: Jan. 9, 2007

(54) ELECTRON BEAM PATTERN GENERATOR WITH PHOTOCATHODE COMPRISING LOW WORK FUNCTION CESIUM HALIDE

(75) Inventors: Juan Ramon Maldonado, Palo Alto, CA (US); Steven T. Coyle, Alameda, CA (US)

(73) Assignee: Applied Materials, Inc., Santa Clara, CA (US)

( * ) Notice: Subject to any disclaimer, the term of this patent is extended or adjusted under 35 U.S.C. 154(b) by 64 days.

(21) Appl. No.: 10/282,324

(22) Filed: Oct. 10, 2002

(65) Prior Publication Data

US 2004/0069960 A1    Apr. 15, 2004

(51) Int. Cl.
*H01J 37/073*    (2006.01)
*H01J 37/317*    (2006.01)

(52) U.S. Cl. .................... 250/492.24; 313/542
(58) Field of Classification Search ............. 250/492.2, 250/311, 310
See application file for complete search history.

(56) References Cited

U.S. PATENT DOCUMENTS

| | | | | |
|---|---|---|---|---|
| 3,631,303 A | * | 12/1971 | Antypas et al. | 257/10 |
| 4,390,789 A | | 6/1983 | Smith et al. | |
| 4,460,831 A | * | 7/1984 | Oettinger et al. | 250/492.2 |
| 4,518,980 A | * | 5/1985 | Guittard et al. | 257/609 |
| 4,554,458 A | * | 11/1985 | Behringer et al. | 250/492.2 |
| 4,694,178 A | | 9/1987 | Harte | |
| 4,820,927 A | | 4/1989 | Langner et al. | |
| 4,950,952 A | * | 8/1990 | Aramaki | 313/542 |
| 5,270,643 A | * | 12/1993 | Richardson et al. | 324/751 |
| 5,395,738 A | * | 3/1995 | Brandes et al. | 430/296 |
| 5,684,360 A | * | 11/1997 | Baum et al. | 313/542 |

FOREIGN PATENT DOCUMENTS

WO    WO 98/50934    * 11/1998

OTHER PUBLICATIONS

R.K. Martin, J.H. Chappell and S.S. Murray, "Relative Quantum Efficiency Measurement of CsI, CsBr and CsI/CsBr Coated Micro Channel Plates," Smithsonian Center for Astrophysics, Cambridge, MA 02138.

* cited by examiner

*Primary Examiner*—Jack I. Berman
(74) *Attorney, Agent, or Firm*—Janah & Associates, P.C.

(57) ABSTRACT

An electron beam pattern generator comprises a laser beam generator to generate a laser beam. A photocathode receives the laser beam and generates one or more electron beams. The photocathode comprises cesium halide material, such as for example, cesium bromide or iodide. The cesium halide material may have a decreased workfunction that allows efficient operation at a wavelength of the laser beam of at least about 200 nm. Electron optics are provided to focus the electron beams onto a substrate that is supported on a substrate support.

31 Claims, 8 Drawing Sheets

ELECTRON BEAM PATTERN GENERATOR WITH PHOTOCATHODE COMPRISING LOW WORK FUNCTION CESIUM HALIDE

GOVERNMENT SUPPORT

This invention was made with Government support under Contract Number N66001-99C-8624 awarded by the Department of the Navy. The Government has certain rights in the invention.

BACKGROUND

Embodiments of the present invention relate to the generation of a pattern on a substrate using electron beams.

An electron beam pattern generator typically comprises an electron beam column in which a single electron beam is generated, modulated, and directed onto a substrate, to expose an electron-sensitive material on the substrate. An electron beam source and modulator generates the electron beam and modulates its intensity. Beam optics focus the electron beam and a beam scanning system scans the electron beam across the substrate. Such pattern generators are used to generate electron beam patterns on electron sensitive resist on substrates, such as a semiconductor wafers and masks.

Conventional pattern generators that use a single electron beam for writing an electron beam pattern on a substrate do not provide a sufficiently high throughput when writing high resolution patterns. A single electron beam can write an electron pattern only at relatively slow speeds across the substrate. For example, at current line width resolutions of 100 to 130 nm, a single electron beam system takes about 6 hours to write a pattern on a 200 mm substrate; however, at resolutions of 35 to 50 nm, the same system would take about 50 hours to write the pattern—which is too long. Thus, single beam systems have limited throughput at high resolutions.

Multiple electron beam pattern generators, which use a plurality of electron beams to generate an electron beam pattern on a substrate, can provide higher throughput and speed even at high resolutions. Multiple electron beams may be drawn from one or more electron sources as separate and well-defined beams. In one method, the multiple electron beams are generated by a photocathode-laser system that directs a modulated laser beam at a particular wavelength or frequency on a photocathode to emit the electron beams. The photocathode comprises a photoemissive material that emits modulated electron beams when illuminated by the laser beam pulses. The laser beam source and optics are selected to generate a laser beam having an energy of at least the workfunction of the photoemissive material to be able to excite the electrons to a suitable energy level when photons of the laser beam impinge on the photoemissive material. Thus, the properties of the photoemissive material and the laser beam generator need to be matched to operate suitably in combination.

However, conventional photocathode-laser systems have several problems. For example, one photocathode-laser system combination comprises an argon-ion laser source, a frequency multiplier crystal, and a photocathode comprising an Mg, MgO or CsTe based photoemissive material. The argon-ion laser source is desirable because it is well characterized, commercially available, and can be frequency matched to energize Mg and MgO photocathodes. One of the fundamental wavelengths of the argon-ion laser is 514 nm. The frequency multiplier crystal reduces the wavelength to about 257 nm to achieve a laser beam having an energy level of about 4.8 eV which is desirable. The frequency multiplied laser beam, with the energy of 4.8 eV, has a higher energy than the workfunction of Mg or MgO photoemissive material, which is 3 to 4 eV, thus the laser system and the photocathode are suitably matched. However, Mg and MgO photocathodes are limited in their current yield by problems such as oxidation and degradation. Oxidation of a Mg photocathode occurs during low pressure operation due to residual oxygen in the chamber and gives rise to deleterious blanking effects that manifest as a change of photoemission when the laser beam is blanked, i.e., turned "on" after an "off" period of a few minutes. MgO photocathodes can also give rise to such deleterious blanking effects. Mg photocathodes also degrade when the material deteriorates over a time period after a few hours of operation in vacuum systems with pressures of, for example, about $1 \times 10^{-10}$ Torr. Other photocathode materials such as CsTe are also often subject to growth of the emission spot during operation and require patterned cathodes.

Thus, it is desirable to have a better and more consistently performing matched photocathode-laser system that is capable of generating multiple electron beams. It is also desirable ensure that the photocathode-laser system is properly matched. It is further desirable to have a photocathode that is stable and can generate electron beams without excessive degradation over time due to oxidation or from being in a vacuum environment. It is also desirable to have an electron beam pattern generating system capable of providing high throughput at good resolutions.

SUMMARY

An electron beam pattern generator comprises a laser beam generator to generate a laser beam; a photocathode to receive the laser beam and generate an electron beam, the photocathode comprising cesium halide; electron optics to focus the electron beam onto a substrate; and a substrate support to support the substrate.

An electron pattern generating method comprises providing a photocathode comprising cesium halide; directing a laser beam onto the cesium halide photocathode at a frequency that is sufficiently high to cause an electron beam to be emitted therefrom; modulating the laser beam or electron beam according to a pattern to form modulated electron beams; and directing the modulated electron beams onto a substrate.

An electron beam pattern generator comprises a diode-pumped or argon-ion laser source and a BBO crystal to generate a laser beam; a photocathode to receive the laser beam and generate an electron beam, the photocathode comprising a cesium bromide layer; electron optics to focus the electron beam onto a substrate; and a substrate support to support a substrate. The photocathode may also comprise cesium iodide instead of cesium bromide.

A method of manufacturing a photocathode for an electron beam pattern generator, the method comprising providing a substrate in a process zone, the substrate selected to be transparent to an incident laser beam; evacuating the process zone; evaporating a cesium halide material in the process zone to deposit cesium halide material on the substrate; and activating the cesium halide material.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

DESCRIPTION

Figure 1:
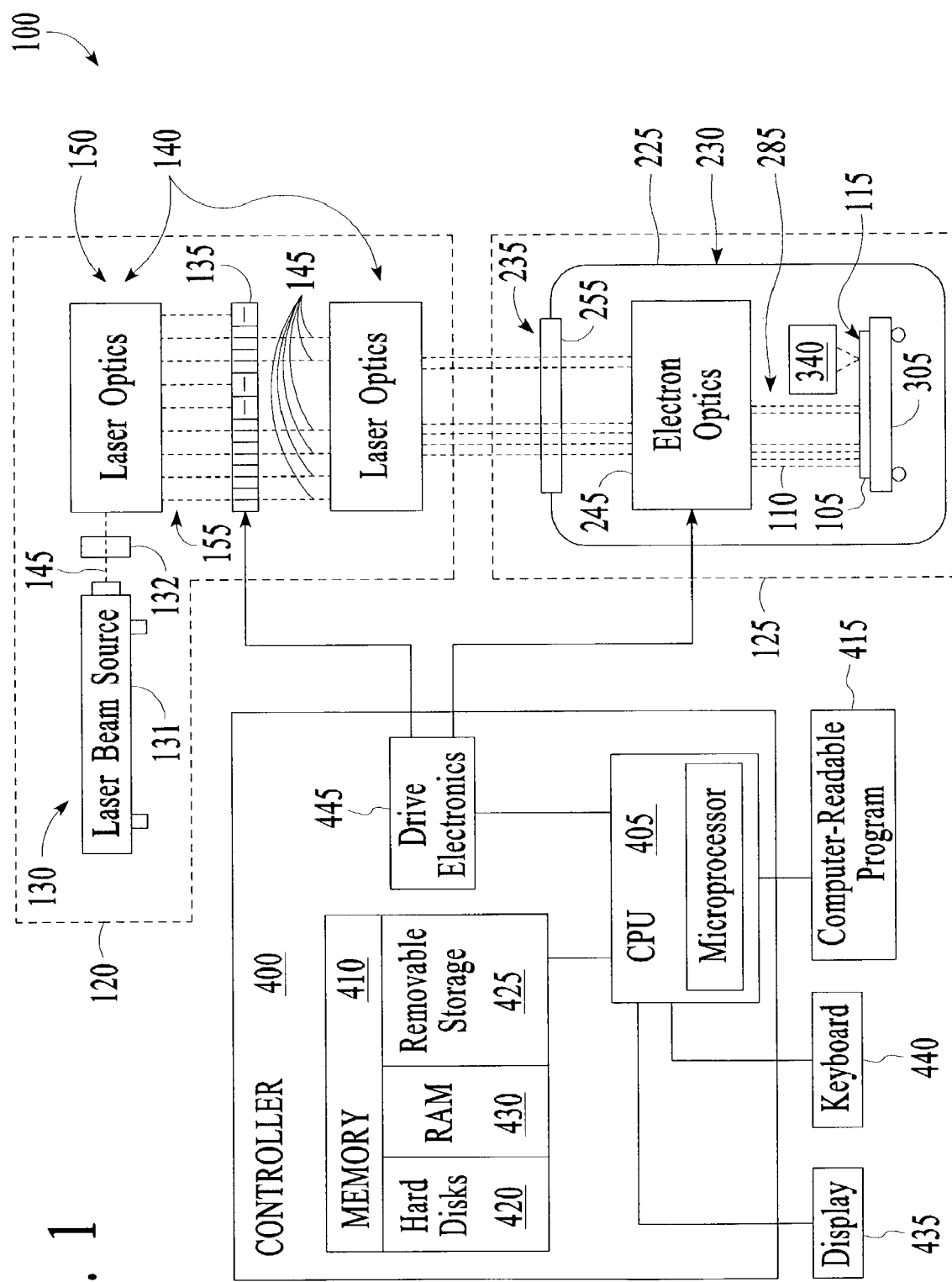
FIG. 1 is a schematic diagram of an embodiment of an electron beam pattern generator having a laser beam section, an electron beam section, and a controller.

An embodiment of an electron beam pattern generator 100 according to the present invention can be used to generate an electron beam pattern on a substrate 105 using multiple electron beams 110, as illustrated in FIG. 1. The electron beam pattern generator 100 is suitable for generating a pattern on a substrate 105 comprising one or more dielectric, semiconductor, or conductor materials, including, for example, metal, polymer, or ceramic materials, which are formed on the substrate 105. The substrate 105 may comprise, for example, a blank mask comprising a transparent plate of glass or quartz, that is coated with an electron-sensitive resist layer 115 (as shown) and a metal layer; a silicon wafer; a compound semiconductor wafer; a printed circuit board (PCB); or a multichip module (MCM). In one embodiment, the substrate 105 comprises an electron-sensitive resist layer 115 having a thickness of from about 50 to about 400 nm. The electron beam pattern imprinted on the resist layer 115 of the substrate 105 may be, for example, a pattern of a mask used in the fabrication of an integrated circuit (IC), display, or printed circuit board (PCB), or a circuit layout of an IC, display, or PCB. When a mask is being exposed to the electron beams 110, after exposure, the exposed resist layer 115 is developed to form a pattern on the mask. After generation of a pattern on an IC, display, or PCB, the substrate materials are etched to form features such as electrically interconnecting wiring or vias, or active or passive devices, such as for example, resistors, capacitors, diodes, and transistors. The features may be shaped as, for example, lines, plugs, cavities, channels, holes and trenches. The apparatus and substrates described herein are illustrative examples, and should not be used to limit the scope of the invention, and the invention encompasses equivalent or alternative versions, as would be apparent to one of ordinary skill in the art.

Figure 2:
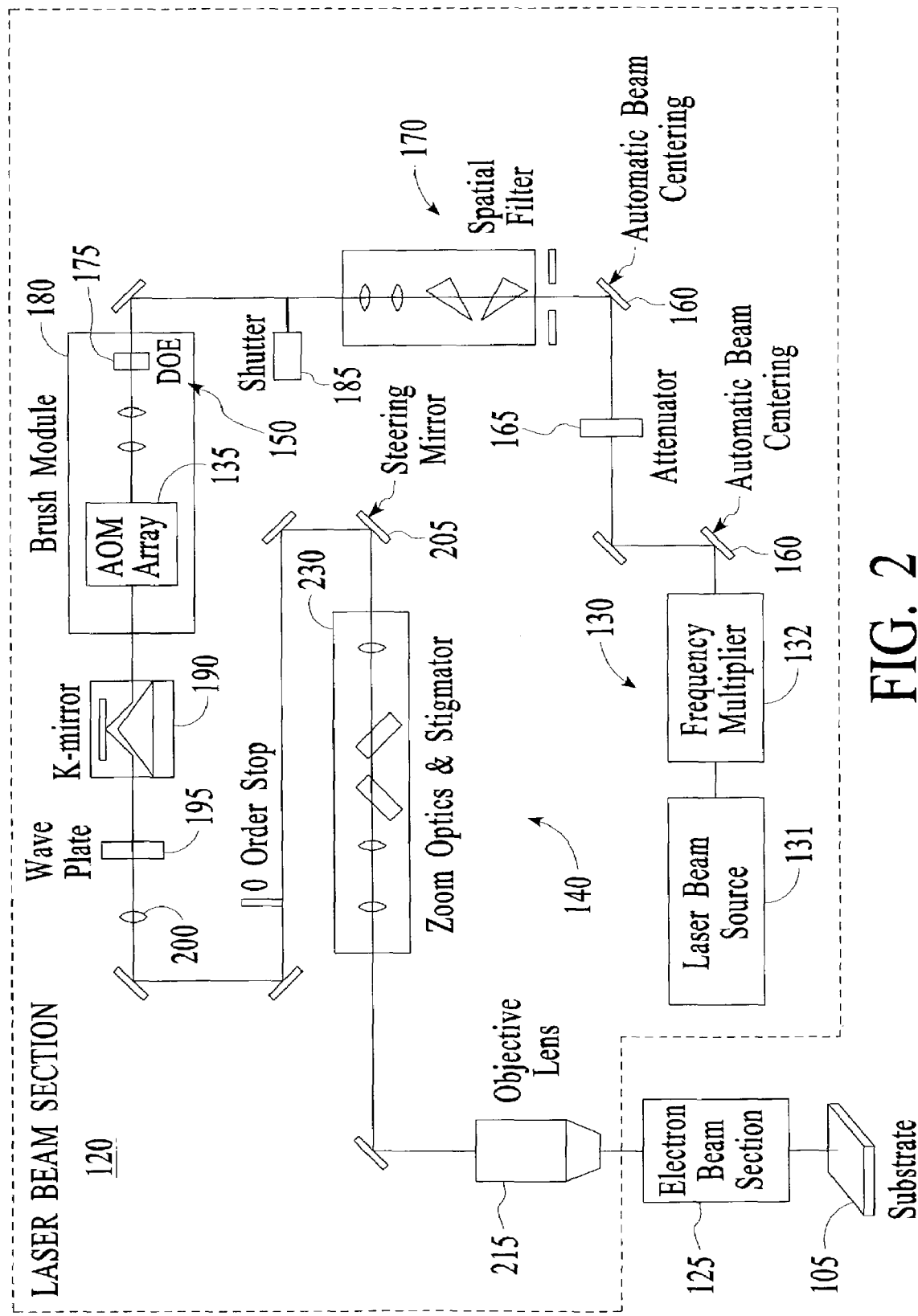
FIG. 2 is a schematic diagram of an embodiment of the laser beam section of FIG. 1.

The electron beam pattern generator 100 includes a laser beam section 120 coupled to an electron beam section 125. The laser beam section 120 includes a laser beam generator 130, beam modulator 135, and laser optics 140, as illustrated in FIG. 2. In one version, the laser beam generator 130 comprises an argon-ion laser source 131. The laser beam generator 130 may also comprise a solid state device. The laser beam generator 130 may also comprise a frequency multiplier 132 to increase the frequency of the laser beam 145 emitted by the laser beam source 131. For example, the frequency multiplier 132 may comprise a beta barium borate (BBO) crystal that approximately doubles the frequency of the laser beam 145. For an argon-ion produced laser beam having a fundamental wavelength of about 514 nm, a BBO crystal can receive the laser beam and double its frequency; in other words, halve its wavelength to about 257 nm. Alternatively, the laser beam generator 130 may comprise a frequency doubled diode-pumped laser source. In one example, the diode-pumped laser source operates at a fundamental wavelength of about 532 nm. In operation, a laser beam 145 is generated by the laser beam source 131 and split into a plurality of individual laser beams 145 by a beam splitter 150. Typically, the laser beams 145 form an array 155 of individual laser beams 145 that enter the beam modulator 135, where the intensities of the laser beams 145 are modulated. For example, the beam modulator 135 may comprise an array of acousto-optic modulators (AOM), which switch the laser beams 145 on or off by acoustically diffracting the laser beams 145 in response to an RF signal, or set the transmitted photon flux of each individual beam to a predetermined intermediate value. In one embodiment, the laser beam 145 is split by a beam splitter 150 into an array 155 of 32 beams and an equivalent number of 32 AOM beam modulator elements are provided. In an AOM array, the modulation of the photon intensity is achieved by applying RF power to the individual AOM channels. Applying different levels of RF power can be used for fine modulation of the light intensity. In another embodiment, the beam modulator 135 comprises a spatial light modulator (SLM) that is adapted to modulate intensities of the laser beams 145. For example, the spatial light modulator may comprise a micro-mechanical diffracting device. SLMs can be advantageous because they may be able modulate a larger number of laser beams 110, such as at least about 100 laser beams 110. A multiple gray level, multiple pass writing strategy may be used. Furthermore, another beam modulator (not shown) may be inserted in the optical system upstream of the splitter 150 to act as a fast auxiliary blanker. This additional beam modulator may be used during scan retrace when additional modulation is needed. In one illustrative embodiment, a 300 MHz carrier frequency is used to diffract the laser beams 145 with an approximately 10 nsec pixel time.

The individual modulated laser beams 145, after passing through the beam modulator 135, are demagnified by the laser optics 140. The laser optics 140 may include optical light lenses focused on a desired plane of the electron beam section 125. The laser beam 145 from the laser beam source 131 may also be actively controlled by automatic beam centering mirrors 160 so that alignment to the optical train, both in position and angle, is maintained. An attenuator 165, which may comprise a combination polarization rotating element and polarizing beam splitter, adjusts the laser power to a range suitable for operation of the system while allowing the laser beam source 131 to operate in a power range optimized for reliability and stability. A spatial filter 170 can remove undesirable sections of the laser beams intensity profile. Anamorphic relay optics may be provided to create a round beam from the laser light exiting this aperture and relay it to the beam splitter 150 comprising a diffractive optical element (DOE) 175 inside a brush module 180. The DOE 175 is a grating that produces a plurality of laser beams 145. For example, the DOE 175 may produce 32 laser beams 145. The laser beams 145 are focused by the lenses inside the brush module 180 to a region typically underneath the additional beam modulator.

A mechanical shutter 185 before the brush module 180 is used to block light from reaching the electron beam section 125 when the electron beam pattern generator 100 is not exposing the substrate 105. A K-mirror 190 allows for rotational adjustment of the linear array of laser beams 145 exiting the additional beam modulator. A wave plate 195 aligns the polarization of the beams for optimal focusing through birefringent photocathode substrates such as sapphire. A lens element 200 after the wave plate 195 focuses the laser beam array 155 onto a focal spot on a steering mirror 205. Before reaching the steering mirror 205, the zero-order (undiffracted) light from the beam modulator 135 is blocked by a zero-order beam stop 210. The steering mirror 205 allows for small positional adjustment of the spot array at the final image plane of an objective lens 215. The zoom optics and stigmator 220 relay the focal spot into the pupil of the objective lens 215. Tilted plates inside the zoom optics and stigmator 220 provide adjustment capability to ensure that the focus of the spots onto the electron beam section 125 occurs in the same plane whether measured along the direction of the array of spots or perpendicular to it. Movable lenses within the zoom optics and stigmator 220 allow for slight magnification adjustment of the laser beam array 155.

Below the laser beam section 120, the electron beam section 125 converts the laser beam image generated by the laser beam section 120 into a corresponding electron beam image. The electron beam section 125 may comprise a vacuum column 225 containing a vacuum environment in which electron beams 110 can be generated to expose the substrate 105 to the electron beam image. The vacuum column 225 comprises walls 230 that are substantially vacuum-tight and are typically made of a material such as aluminum. One or more vacuum pumps (not shown) are provided to evacuate the vacuum column 225 to create and maintain the vacuum environment. In one embodiment, the vacuum pumps provide a first vacuum environment at the top portion of the vacuum column 225, and a second vacuum environment which may have a different vacuum pressure at the bottom portion of the vacuum column 225. For example, the first vacuum environment may be at a gas pressure of about $10^{-9}$ Torr and the second vacuum environment may be at a gas pressure of about $10^{-6}$ Torr. A pressure barrier may also be provided between the vacuum environments to maintain the pressure difference.

Figure 3:
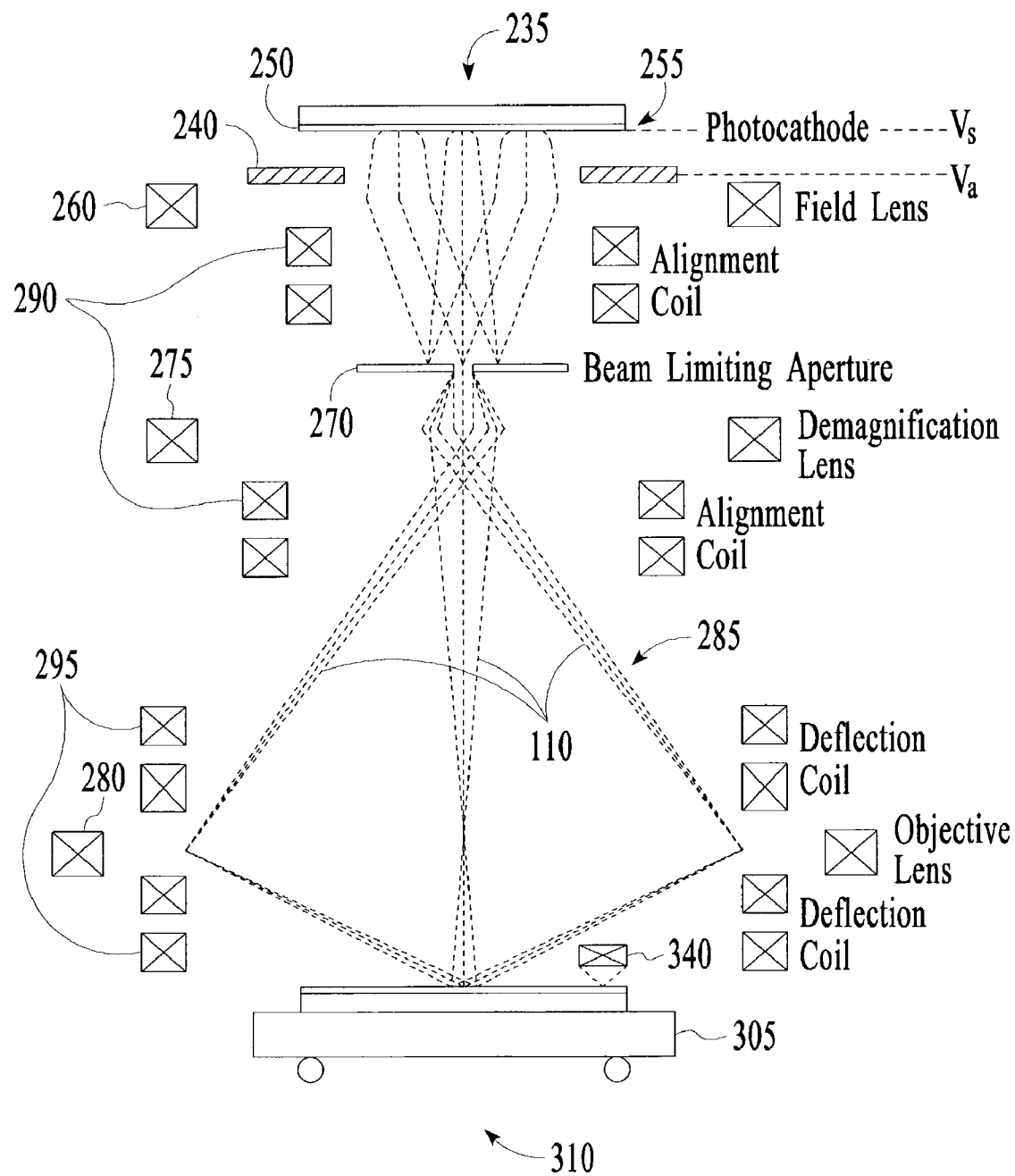
FIG. 3 is a sectional side view of an electron beam section of the electron beam pattern generator of FIG. 1, the electron beam section comprising a multiple electron beam source, electron optics, beam retarding system, and beam scanner.
Figure 4:
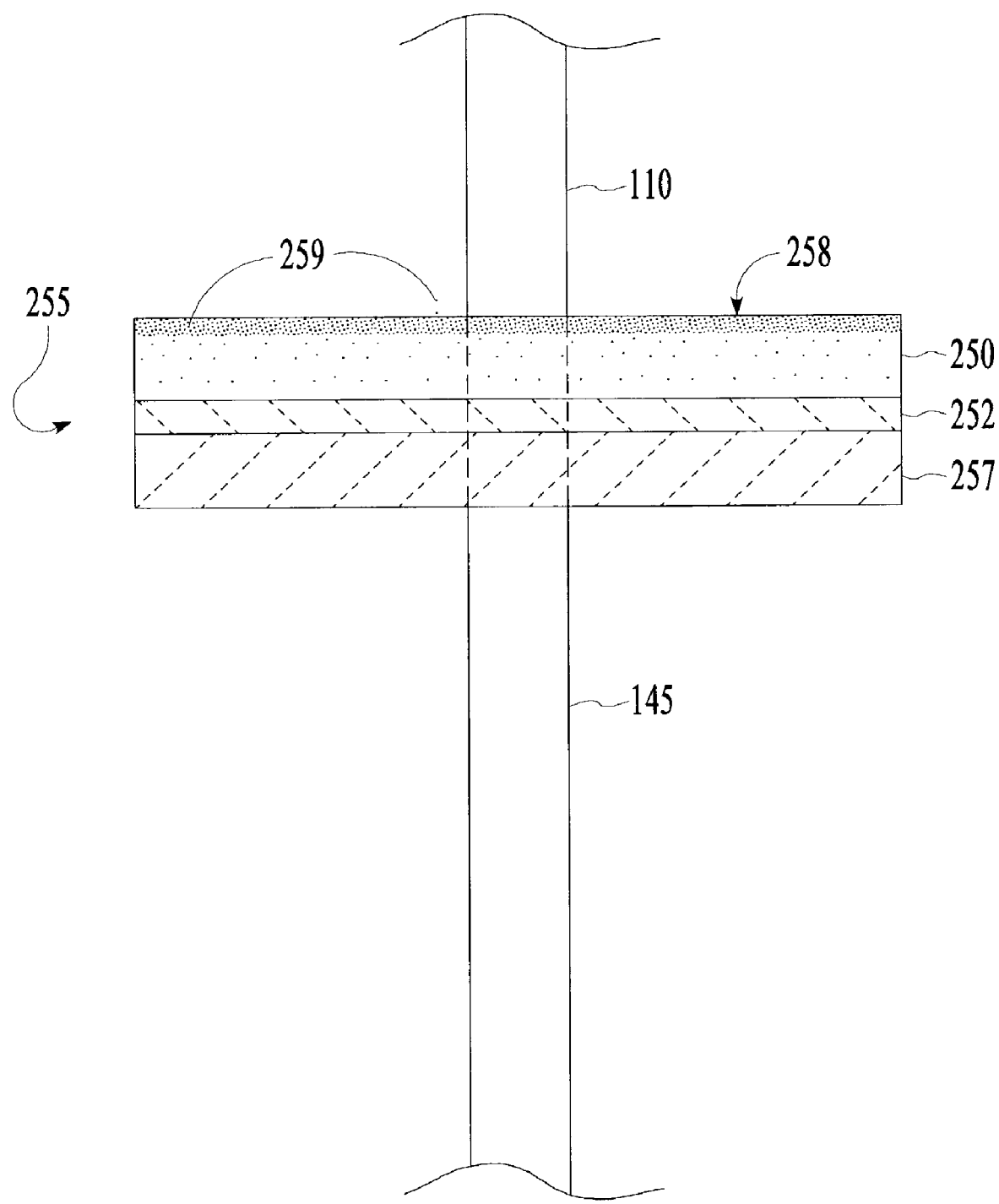
FIG. 4 is a sectional side view of a photocathode comprising a substrate having a photoemissive cesium halide layer with a density gradient of cesium.

The electron beam section 125 includes a photocathode 255 according to the present invention, an anode 240, and electron optics 245, as illustrated in FIG. 3. In operation, the laser optics 140 focus the laser beam array 155 exiting the beam modulator 135 onto a photoemissive layer 250 of a photocathode 255 of the multiple electron beam source 235. The photocathode 255 receives the laser beam image and generates a corresponding electron beam image out of multiple electron beams 110. The photocathode 255, an embodiment of which is illustrated in FIG. 4, may additionally comprise a substrate 257 that is transparent to the laser beams 145 as they pass through the photocathode substrate 257 to the photoemissive layer 250. For example, the photocathode substrate 257 may comprise sapphire. Additionally, the photocathode 255 may comprise a conductive layer 252 between the transparent substrate 257 and the photoemissive layer 250. In operation, photons absorbed in the photocathode 255 excite electrons above the energy level of the vacuum, and a portion of the electrons that are sufficiently excited are emitted into the vacuum. For example, the photocathode 255 may have a photoyield of at least about 20 nA/mW. During installation of the photocathode 255 in the electron beam pattern generator 100, the photocathode 255 may be transferred within a continuous vacuum environment into the electron beam section 125.

In one version, the photocathode 255 comprises a photoemissive layer 250 comprising cesium halide material having an electron workfunction of from about 2 to about 4 eV. By cesium halide material it is meant a material comprising at least cesium atoms and halogen atoms, which may be, for example, a cesium compound such as cesium bromide or cesium iodide, or other compounds comprising cesium and halogen and not necessarily limited to particular stoichiometric formulations of cesium halides, but which provide the desirable workfunction range. In addition, the cesium halide material can be a compound comprising other materials, beside cesium and halogen. In one embodiment, the cesium halide containing photoemissive layer 250 has a thickness of from about 10 to about 25 nm, and is formed on a substrate 257 that is transparent to the laser generated light as modified by the frequency multiplier crystal. A suitable substrate 257 comprises an aluminum oxide wafer, such as a sapphire disk. In addition, the substrate 257 may have a conductive layer 252 thereon and below the photoemissive layer 250.

In one version, a photoemissive layer 250 according to an embodiment of the present invention comprises cesium bromide material. This particular cesium bromide material can yield a quantum efficiency of at least about 0.1% when irradiated with approximately 4.8 eV photons (257 nm), and an energy spread of about 1 eV.

In another version, the photoemissive layer 250 comprises cesium iodide material. The cesium iodide material may be advantageous because it may be more stable in terms of temperature resistance or corrosion resistance.

In one embodiment, the cesium halide material has a concentration gradient of cesium or halogen through the thickness of the material, particularly in relation to a concentration at the surface of a layer of the material and at an inside region of the layer. It is believed that the lower workfunction of the photocathode material occurs because of the higher concentration levels of cesium in portions of the photoemissive layer 250. For example, when the surface of the photoemissive layer 250 has a higher concentration of cesium, it can result in lowering of the threshold work function or energy level required for electrons to be emitted from the surface. The higher surface concentration may result from the diffusion of cesium from underlying portions of the cesium halide containing layer into the surface portions during, for example, UV activation by the 257 nm laser, temperature annealing of the as-deposited layer and/or if the atmosphere around the layer causes migration of cesium atoms toward the surface. Yet another mechanism could arise from the nucleation of a cesium rich or cesium poor layer in the initial or final stages of deposition. A surface rich cesium layer could also occur due to vaporization of the volatile halogen species from the surface in the process of fabrication.

The resultant concentration gradient of cesium atoms through the thickness of the deposited photoemissive layer 250, which may arise from the higher concentration of cesium in the surface portion of the cesium halide layer, causes the electron workfunction to be lowered to the desirably lower levels. Thus, a photoemissive layer 250 comprising cesium halide material has a lower electron workfunction of from about 2 to about 4 eV instead of a much higher expected workfunction in the range of 7 to 8 eV of a conventional material, such as CsBr which has a workfunction of about 7.8 eV. As a result, the instant cesium halide material can be operated with a laser beam 145 having an original wavelength of at least about 400 nm, and which may be, optionally, frequency multiplied by a BBO crystal to have a divided wavelength of at least about 200 nm. When such radiation illuminates the photoemissive layer 250 comprising the cesium halide, electrons are emitted therefrom. Thus the improved photocathode 255 having a photoemissive layer 250 comprising the cesium halide material, for example, cesium bromide or cesium iodide material, can emit electrons more reliably and at lower laser beam frequencies than many conventional photocathodes.

In one embodiment of a photocathode 255 comprising a photoemissive layer 250 of cesium halide, the cesium halide is deposited as a layer and has a density gradient of cesium atoms 259 through the thickness of the layer. When the laser beam 145 illuminates the photoemissive layer 250, the emission surface 258 having the higher cesium concentration has an effectively lowered workfunction, allowing a longer-wavelength lower energy laser beam 145 to cause electron emission from the material surface. In one embodiment, the workfunction at the emission surface 258 of a cesium bromide or cesium iodide layer can even be less than about 4.8 eV, such as about 2.1 eV. Thus, an argon-ion laser beam 145 having a wavelength of at least about 257 nm may be used to irradiate such a photocathode 255 and still cause electrons to be emitted. For example, the laser beam 145 may have a wavelength of about 532 nm. The photoyield of the 532 nm laser beam is significantly lower than the corresponding one for the smaller-wavelength laser beam, such as the 257 nm laser beam.

Figure 5:
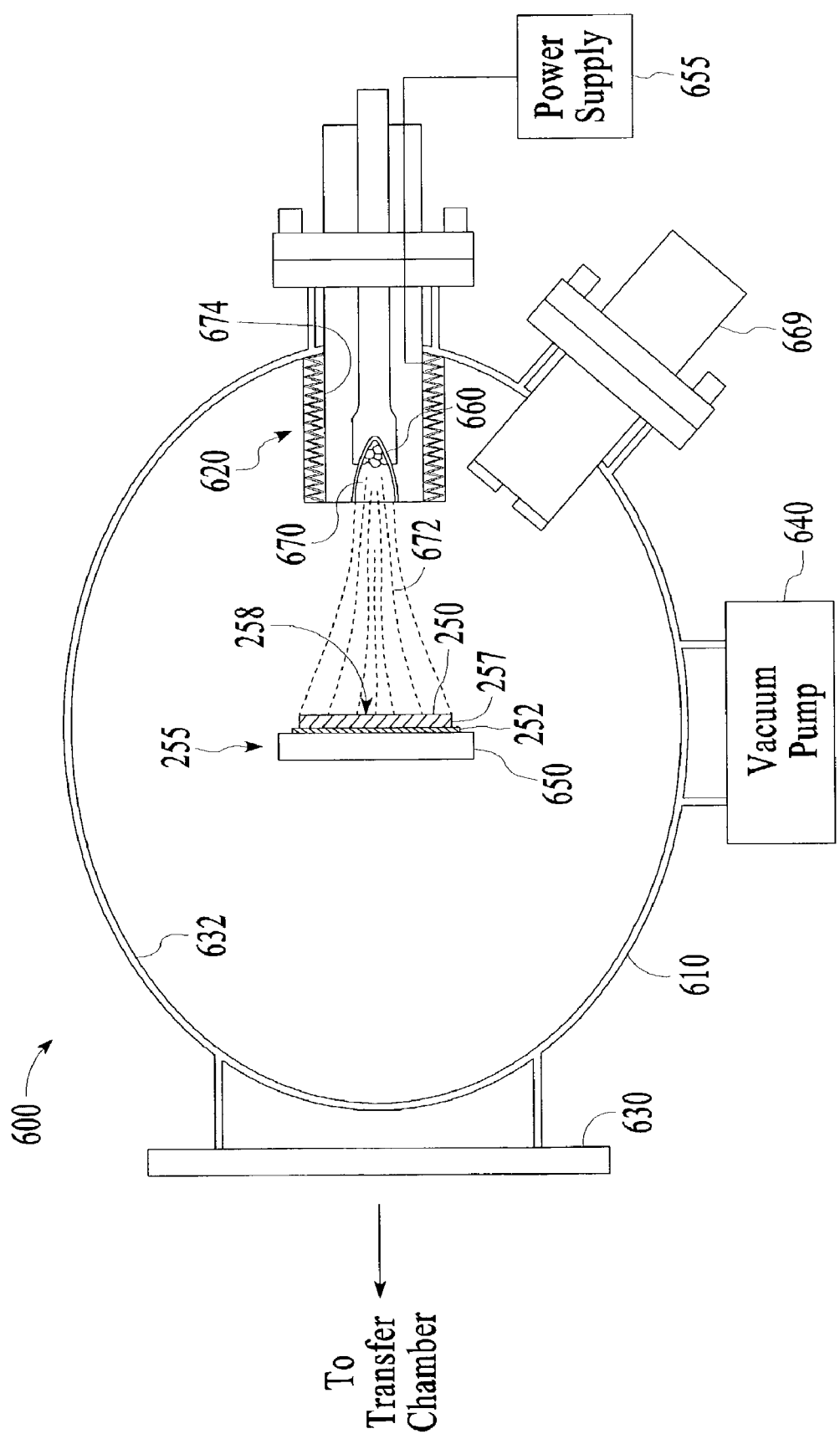
FIG. 5 is a schematic diagram of a photocathode deposition system that can be used to make the photocathode of FIG. 4.

The improved photocathode 255 can be manufactured in a photocathode deposition system 600, an embodiment of which is illustrated in FIG. 5. In one embodiment, the photocathode deposition system 600 comprises a plurality of chambers, such as including a sublimator chamber 610 for deposition of both the conductive layer 252 and the photoemissive layer 250, and a transfer or analysis chamber (not shown) which may be used for post-deposition analysis of the photocathode 255. The photocathode substrate 257 is placed in the sublimator chamber 610, and one or more effusion cells 620 in the sublimator chamber 610 sublimate the material to be deposited and direct the sublimated material toward the photocathode substrate 257. One or more hermetic channels 630 may be provided between the chambers to allow transfer of the photocathode substrate 257 between the chambers without intermediate exposure to the external atmospheric environment.

The sublimator chamber 610 may comprise metal walls 632, such as walls made of stainless steel. A vacuum pump 640, such as an ultra-high vacuum pump, for example an ion pump, evacuates the sublimator chamber 610 to maintain the sublimator chamber 610 at ultrahigh vacuum. The vacuum pump 640 may comprise, for example, an ion pump. In one embodiment, the vacuum pump 640 can provide an environment in the chamber having a gas pressure of from about $10^{-8}$ to about $10^{-11}$ Torr. Liquid nitrogen shrouding is used to provide cold surfaces within the sublimator chamber 610 to further reduce unwanted contaminants. The photocathode substrate 257 is mounted on a substrate holder 650, which is maintained at a selected temperature for film growth by a power supply 655. An instrument (not shown) may be provided to measure the temperature of the photocathode substrate 257. For example, the instrument may comprise an optical pyrometer that has a thermocouple attached to the substrate holder 650, or another type of temperature probe.

An electron beam evaporator 669 is provided in the sublimator chamber 610 to evaporate material onto the photocathode substrate 257 to form the conductive layer 252. A typical conductive layer that also transmits the laser beams 145 with sufficiently low attenuation may be formed from a molybdenum film. For example, the molybdenum film may have a thickness of less than about 10 nm in order to provide an attenuation of less than about 20% at 257 nm. The evaporator 669 operates by directing a beam of electrons onto a metal wire. The metal may be, for example, molybdenum or another metal with sufficiently low ultraviolet attenuation and good wetting and adhesion properties may also be used.

The effusion cell 620 further comprises a crucible 660 for sublimating a source of cesium halide or conductive material 670 placed into the crucible 660. A collimated beam of molecules 672 is generated for epitaxial formation of a film matrix. The crucible 660 may be of any desired shape and may be composed from any suitable material such as ceramic, graphite, tantalum, molybdenum, and pyrolytic boron nitride. The crucible 660 is secured to a frame connected to a flange for attachment of the effusion cell 620 to the sublimator chamber 610. The sublimator chamber 610 is evacuated to form an ultra-high vacuum oxygen-free environment in which the effusion cell 620 can operate. The source material 670 in the crucible 660 may be heated separately by a heating assembly 674 surrounding the crucible 660 to control the sublimation of the source material 670 from solid to vapor form. For example, in one embodiment the source material 670 is heated to a temperature of from about 300 to about 500° C.

Figure 8:
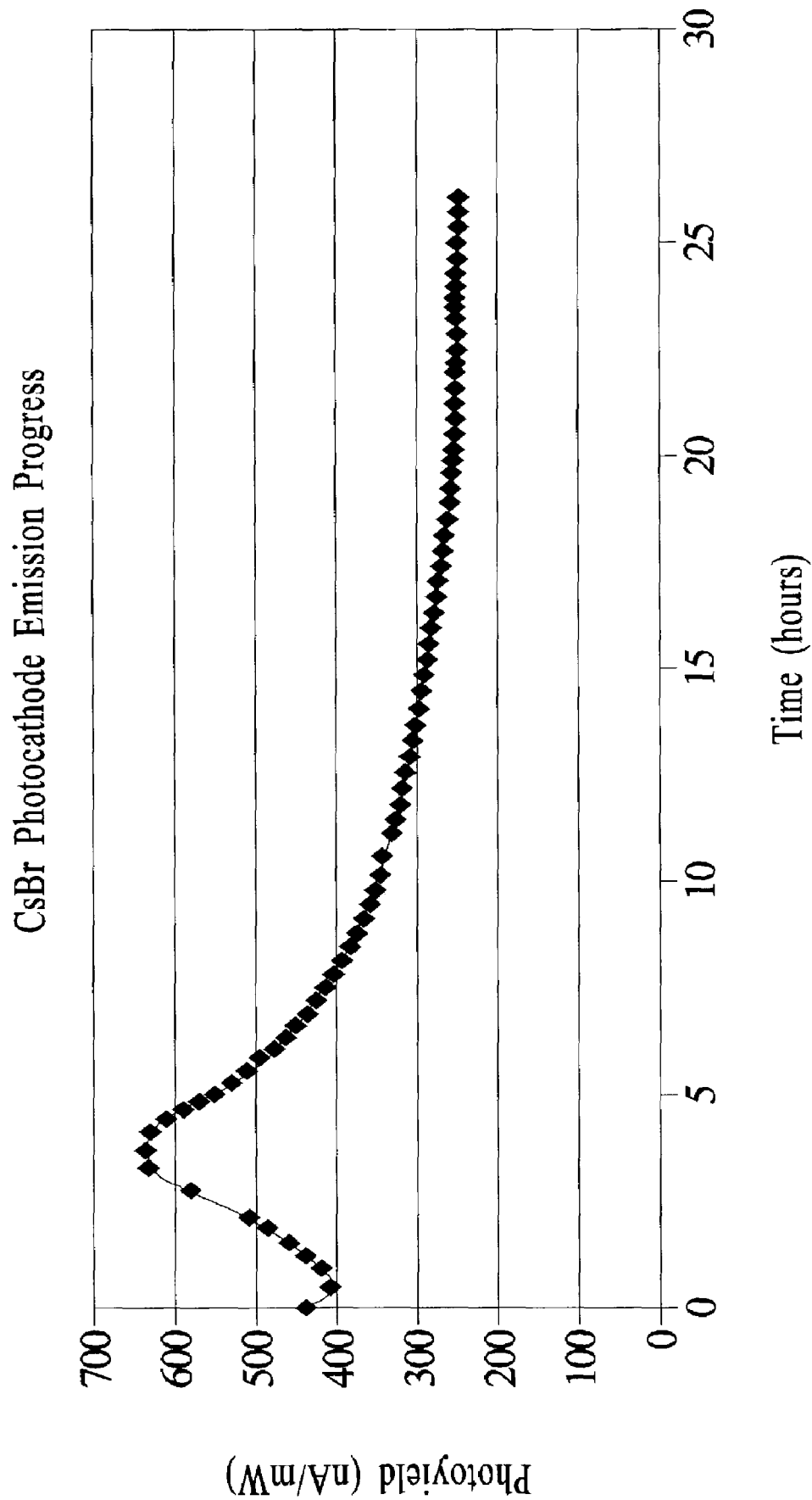
FIG. 8 is a plot of emission progress of a CsBr photocathode as it is being illuminated by a 257 nm argon-ion laser.

After deposition of the cesium halide material 670 on the photocathode substrate 257, the layer of deposited cesium halide is activated by illumination with light. It is believed that the activation step causes the cesium to diffuse to the surface of the cesium halide material 670 to generate a higher concentration of cesium at the surface. This is believed to reduce the work function of the cesium halide material 670 at the surface where it is needed to reduce the energy required to excite the electrons out of the surface. For example, the cesium halide material 670 may be activated to sufficiently lower its workfunction and thereby allow efficient operation of the photocathode 255 at a laser beam wavelength of at least about 200 nm. A wavelength that desirably activates the cesium halide material 670 may be, for example, less than about 365 nm. In one embodiment, the cesium halide material 670 is heated to a temperature of from about 60 to about 500° C. The activation step may be conducted by exposing the cesium halide material 670 to a laser beam for a time period. For example, the activation may be performed by directing a frequency multiplied argon-ion laser beam onto an as fabricated photocathode for a time of from about 2 to about 4 hours. An example of the emission progress of a CsBr photocathode illuminated by a 257 nm argon-ion laser is shown in FIG. 8. A stable photoyield greater than 200 nA/mW is obtained after a few hours. In one embodiment, the photocathode 255 can be run routinely for at least about 150 hours without appreciable degradation. Alternative activation methods, such as illumination with a helium arc ultraviolet lamp, heating in a controlled environment, such as a low pressure environment or in an inert environment, heat lamps, or a resistor furnace may also be used. It is believed that the present process is different from conventional manufacturing processes because it results in a concentration gradient of cesium through the thickness of the photoemissive layer 250, such as for example, a cesium halide material 670 having a higher cesium concentration at the surface of a layer of the material. This gives rise to a higher cesium to halogen ratio at the surface of the material 670.

Returning to FIG. 3, the photocathode 255 forms an extraction field between itself and the anode 240 to draw electron beams 110 from the photocathode 255 and accelerate the electron beams 110 toward the substrate 105. For example, the extraction field may have a strength of from about 5 to about 10 kV/mm. The electrons are accelerated to an initial energy level to draw the electrons from the multiple electron beam source 235 and form the electrons into multiple defined electron beams 110. The energy level is selected to be sufficiently high to substantially prevent interactions between the electron beams 110. When the electron beams 110 are moving vertically at a higher velocity, lateral interactions between the electron beams 110 are typically less significant than when the electron beams 110 are moving at lower velocities. In one embodiment, the electron beams 110 are accelerated to an energy of from about 40 keV to about 60 keV, such as about 50 keV. The electron beams 110 may have a brush width of from about 40 to about 90 microns, such as about 65 microns. Each electron beam 110 has a width of from about 270 to about 330 nm. When a voltage is applied to the anode 240, the electrons are accelerated and focused to form a multibeam virtual electron image of the photocathode emission surface corresponding to the laser beam image generated by the laser beam source 131. In one embodiment, the photocathode 255 is biased at about −50 kV, and is separated from a grounded anode 240 by an accelerating gap. The anode 240 is typically a planar electrode with an aperture in the center.

The electron beam pattern generator 100 further comprises electron optics 245 to shape the electron beams 110, such as to focus, demagnify, stigmate, or align the electron beams 110. Optionally, an electron field lens 260 near the photocathode 255 is used to reduce off-axis aberrations in demagnification lenses 265 that follow. Further details of exemplary electron optics are shown in commonly-assigned U.S. Pat. No. 6,215,128 by Mankos et al., titled "A Compact Photoemission Source, Field and Objective Lens Arrangement for High Throughput Electron Beam Lithography," filed on Mar. 18, 1999, which is hereby incorporated by reference in its entirety. The field lens 260 collimates the electrons exiting the accelerating region above the anode 240 and forms a crossover in the plane of a beam-limiting aperture 270. The virtual image created by the field lens 260 is then subsequently demagnified by the demagnification and objective magnetic lenses 275, 280 to form an array 285 of focused electron beams 110. A set of alignment coils 290 is used to center and stigmate the electron beam array 285 in the beam-limiting aperture 270 and in the objective lens 280.

In one embodiment, a beam scanner 295 comprising a set of magnetic beam deflection coils is used to scan the array 285 of individually modulated electron beams 110 across the substrate 105. Another set of magnetic deflection coils 300 performs dynamic stigmation and focus as the electron beam array 285 is scanned across a field of the substrate 105. This allows dynamic stigmation, focus, or x/y deflection corrections to be applied to different parts of the scan field.

The electron beam pathway traversed by the electron beams 110 can be a straight line, a curved line, or a series of connected straight lines. Thus, the apparatus components, such as the multiple electron beam source 235, anode 240, and beam scanner 295, may be vertically oriented in a column above the substrate 105, or may be oriented in an angled configuration (not shown), such as a right-angled configuration, or may be oriented in a curved configuration (also not shown).

The electron beam pattern generator 100 further comprises a substrate support 305 capable of supporting the substrate 105. The support 305 may comprise an electrostatic chuck (not shown) capable of holding the substrate 105 against the support 305. The electron bean pattern generator 100 may also comprise support motors capable of moving the support 305 to precisely position the substrate 105 in relation to the electron optics 245 or to move the substrate 105 to scan the electron beams 110 across the substrate 105. For example, the support motors may comprise electric motors that translate the support 305 in the 'x' and 'y' directions along an x-y plane parallel to the substrate surface, rotate the support 305, elevate or lower the support 305, or tilt the support 305. The electron beam pattern generator 100 may further comprise support position sensors capable of precisely determining the position of the support 305. For example, the support position sensors may reflect a light beam (not shown) from the support 305 and detect the intensity of the reflected beam, where interferometric analysis indicates the distance between the substrate support 305 and the support position sensors.

Exposure throughput refers to the area of the pattern exposed on the substrate 105 per unit time, and determines the speed of pattern generation. A first factor affecting throughput is the total current needed to pattern a substrate 105. A certain fraction of the electron-sensitive resist 115 is to be exposed. To a first approximation, this exposure occurs after a particular electron dose, which can be calculated for a resist 115 of given sensitivity. The throughput is determined by the time required to deliver this dose, which is proportional to the maximum total electron current. This total current is proportional to the number of electron beams $N_b$ and the current $I_b$ delivered by each electron beam 110. Thus the time ô to expose a given area is $ô=AS/N_b I_b$, where A is the area to be patterned and S is the resist sensitivity (charge density required to expose the resist). High throughput can be achieved by using a sufficiently large number of electron beams 110 and a sufficiently large current in each electron beam 110.

The electron beam pattern generator 100 further comprises a controller 400 comprising a suitable configuration of hardware and software to operate the components of the electron beam pattern generator 100 to generate an electron beam pattern on the substrate 105. An exemplary controller 400 is illustrated in FIG. 1. For example, the controller 400 may comprise a central processing unit (CPU) 405 that is connected to a memory 410 and other components. The CPU 405 comprises a microprocessor, such as a complex instruction set computer (CISC) microprocessor, for example a Pentium (TM) microprocessor commercially available from Intel Corporation, Santa Clara, Calif., or a reduced instruction set computer (RISC) microprocessor, capable of executing a computer-readable program 415. The memory 410 may comprise a computer-readable medium such as hard disks 420 in a redundant array of independent disks (RAID) configuration, removable storage 425 such as an optical compact disc (CD) or floppy disk, random access memory (RAM) 430, and/or other types of volatile or non-volatile memory. The interface between a human operator and the controller 400 can be, for example, via a display 435, such as a cathode ray tube (CRT) monitor, and an input device, such as a keyboard 440. The controller 400 may also include drive electronics 445 such as analog and digital input/output boards, linear motor driver boards, or stepper motor controller boards.

Figure 6:
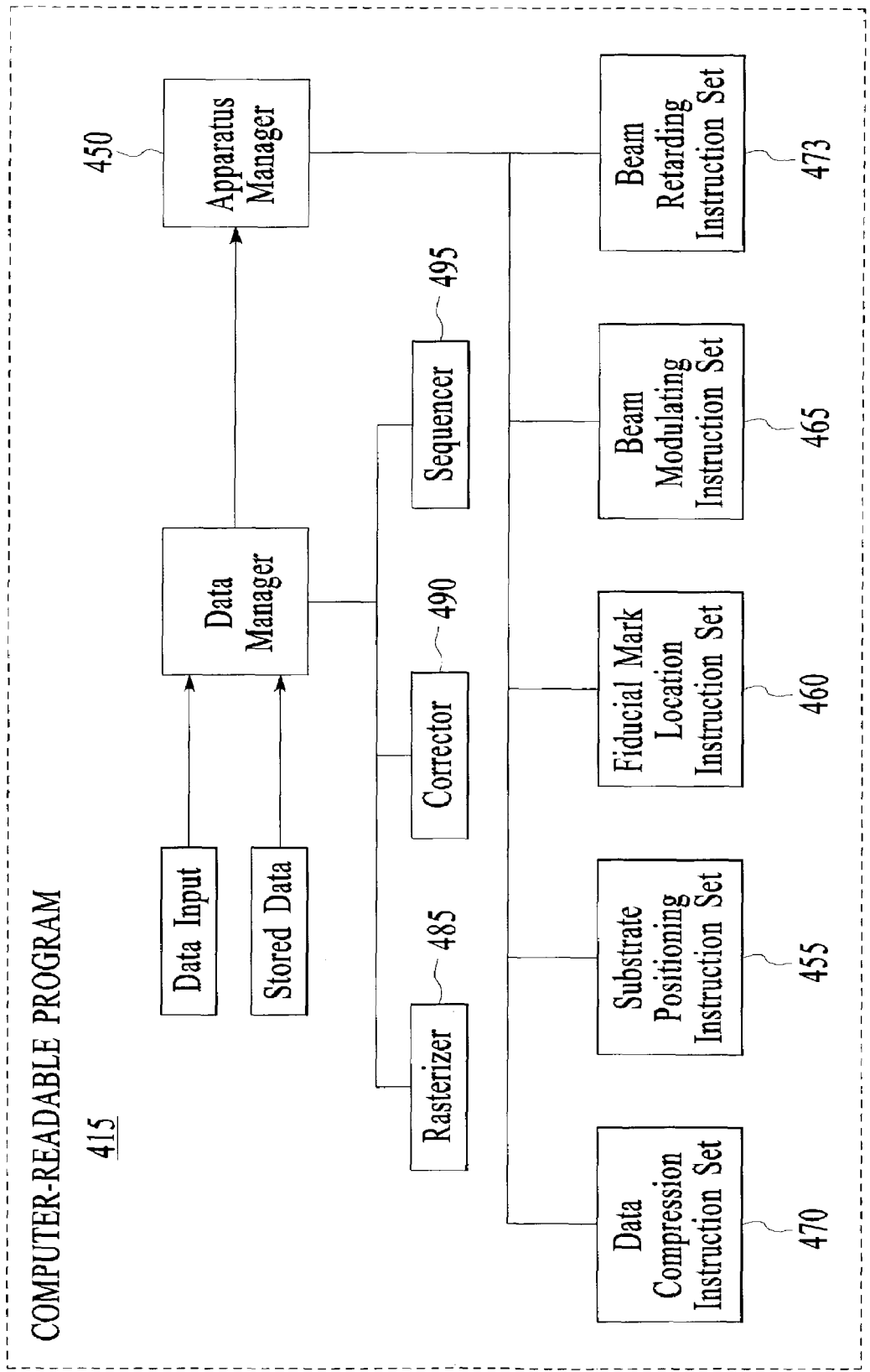
FIG. 6 is a schematic diagram of an embodiment of a computer-readable program executed by the controller shown in FIG. 1.

The computer-readable program 415 generally comprises software comprising sets of instructions to operate the apparatus components, and an apparatus manager 450 to manage the instruction sets, as illustrated in the exemplary version of FIG. 6. The computer-readable program 415 can be written in any conventional programming language, such as for example, assembly language, C, C++ or Pascal. Suitable program code is entered into a single file, or multiple files, using a conventional text editor and stored or embodied in the memory 410 of the controller 400. If the entered code text is in a high level language, the code is compiled, and the resultant compiler code is then linked with an object code of pre-compiled library routines. To execute the linked, compiled object code, the user invokes the feature code, causing the CPU 405 to read and execute the code to perform the tasks identified in the computer-readable program 415. Using a keyboard interface, a human user enters commands or registration parameters into the computer-readable program 415 in response to menus or screens displayed on the display 435. The computer-readable program 415 may include instruction sets to, for example, control the positioning of the substrate support 305 (instruction set 455), locate the fiducial marks (instruction set 460), control beam modulation (instruction set 465), control data compression (instruction set 470), and control the retarding of the electron beams 110 (instruction set 473). The instruction sets may receive parameters, such as a data file corresponding to the support position, the fiducial mark locations, the electron beam pattern, or instructions entered by the human operator.

The controller 400 is adapted to generate, send, and receive signals to operate the apparatus components to generate a pattern on the substrate 105 using electron beams 110. For example, the controller 400 may send signals to the beam modulator 135 to control modulation of the electron beams 110 to the desired intensity levels and in correspondence to the electron beam pattern data. The beam modulator 135 may also be controlled to scale the electron beam pattern in the scanning direction by timing the beam pulses, and the support motors may also receive real-time instructions from the controller 400 to control the position of the substrate 105 to scale, rotate, or offset the pattern generated by the electron beams 110 on the substrate 105. As another example, the controller 400 may also operate the fiducial mark locator 340 by receiving measured locations of the fiducial marks and comparing them to their intended locations to determine the deviation of each fiducial mark.

Figure 7:
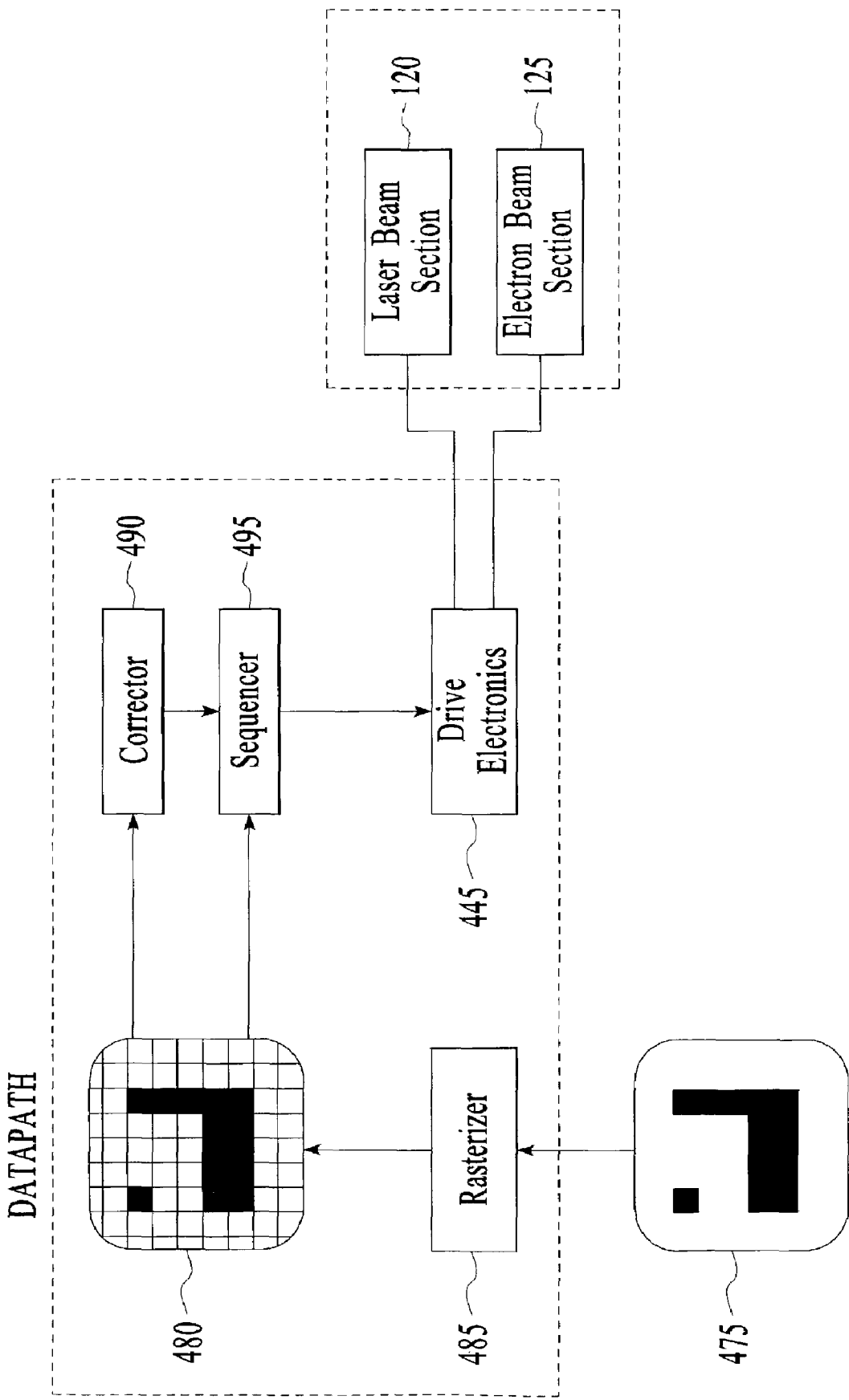
FIG. 7 is a block diagram of an embodiment of a data path for generating a raster scanning data pattern.

The controller 400 may control the beam modulator 135 and beam scanner 295 of the electron beam pattern generator 100 to scan the electron beams 110 across the substrate 105 according to a raster method, or alternatively, according to a vector method. Depending on the scanning method used, the pattern data that are stored in the memory 410 and communicated to the beam modulator 135 are also different. FIG. 7 is a block diagram showing a data processing path for a raster scanned electron pattern. In a raster method, the pattern data 475 are processed into a bitmap 480 by a rasterizer 485 and the bitmap 480 is stored in the memory 410. An exemplary rasterizer 485 is described in commonly-assigned U.S. Pat. No. 5,533,170 by Teitzel et al., titled "Rasterizer for a Pattern Generation Apparatus," filed on Nov. 22, 1994, which is hereby incorporated by reference in its entirety. Thereafter, a corrector 490 corrects the bitmap to compensate for proximity effects, heating effects, or other undesirable effects. A sequencer 495 then sequences the corrections to apply to the sequenced bitmap to modulate the electron beams 110. Control of pixel dosage is determined by the modulation of the electron beams 110 as a function of time. The electron beams 110 are scanned across the substrate 105 in a substantially predetermined sequence of parallel scan lines to generate the pattern on the substrate 105.

In a vector scanning method, in contrast, the pattern data are stored as vectors. For example, data corresponding to a line can be stored as a vector comprising a starting position, a length, and a direction. Additionally, certain other shapes may be stored in a way that refers to the characteristic dimensions of the shapes. The electron beams 110 are scanned across the substrate 105 along paths that correspond to the pattern vectors. For example, to draw a line, the beam scanner 295 could deflect an electron beam 110 to the starting position in a first step, the beam modulator 135 turns on the electron beam 110 in a second step, the beam scanner 295 deflects the turned-on electron beam 110 through the length of the line in a third step, and the beam modulator 135 turns off the electron beam 110 in a fourth step.

Typically, the electron beams 110 are spatially distributed such that optical interference and other crosstalk between them are reduced or eliminated. However, typically a final exposed pattern in the resist layer 115 produced by raster scanning is composed of overlapping spots, which can be accomplished by employing an interlaced scan print strategy and writing with multiple passes. FIGS. 7 and 8 illustrate an embodiment of such an interlaced raster scanning apparatus and data processing sequence. The controller 400 may contain pattern data in the memory 410 in either flat or hierarchical formats. The flat formats contain the pattern information in a raw form that is not organized by hierarchy or otherwise compressed. In contrast, the hierarchical formats contain the pattern information in a compressed hierarchical organization that expedites transmission from the memory 410 to the beam modulator 135.

Although the present invention has been described in considerable detail with regard to certain preferred versions thereof, other versions are possible. The present invention could be used with other electron beam pattern generators 100 or other equivalent configurations as would be apparent to one of ordinary skill in the art. For example, the electron beam pattern generator 100 may generate a pattern on a substrate 105 using electron beams 110 that are created and modulated directly rather than in the initial laser beam section 120. Thus, the appended claims should not be limited to the description of the preferred versions contained herein.

What is claimed is:

1. An electron beam pattern generator comprising:
   (a) a laser beam generator to generate a laser beam;
   (b) a photocathode to receive the laser beam and generate an electron beam, the photocathode comprising an activated cesium halide photoemissive layer having a thickness with a concentration gradient of cesium therethrough;
   (c) electron optics to focus the electron beam onto a substrate; and
   (d) a substrate support to support the substrate.

2. An apparatus according to claim 1 wherein the activated cesium halide photoemissive layer comprises activated cesium bromide or activated cesium iodide.

3. An apparatus according to claim 1 wherein the concentration of cesium at a surface region of the activated cesium halide photoemissive layer is higher than the concentration of cesium at an inside region of the layer.

4. An apparatus according to claim 1 wherein the laser beam generator comprises a diode-pumped or argon-ion laser source and a frequency multiplier crystal.

5. An apparatus according to claim 1 wherein the laser beam generator comprises:
(a) a laser beam source to provide a laser beam having a wavelength of at least about 400 nm; and
(b) a frequency multiplier to decrease the wavelength of the laser beam to at least about 200 nm.

6. An apparatus according to claim 1 wherein the laser beam generator comprises:
(a) a diode-pumped or argon-ion laser beam generator; and
(b) a BBO crystal.

7. An apparatus according to claim 1 wherein the activated cesium halide photoemissive layer comprises a surface concentration of cesium that is sufficiently high to reduce the electron work function at the surface to from about 2 to about 4 eV.

8. An apparatus according to claim 1 wherein the activated cesium halide photoemissive layer comprises a surface concentration of cesium that is sufficiently high to reduce the electron work function at the surface from about 7 to 8 eV in the conventional material, to about 2 eV in the activated material.

9. An electron pattern generating method comprising:
(a) providing a photocathode comprising an activated cesium halide photoemissive layer having a thickness with a concentration gradient of cesium therethrough;
(b) directing a laser beam onto the activated cesium halide photoemissive layer at a wavelength that is sufficiently low to cause an electron beam to be emitted therefrom;
(c) modulating the laser beam or electron beam according to a pattern to form modulated electron beams; and
(d) directing the modulated electron beams onto a substrate.

10. A method according to claim 9 comprising providing a photocathode wherein the activated cesium halide photoemissive layer comprises activated cesium bromide or activated cesium iodide.

11. A method according to claim 9 wherein the activated cesium halide photoemissive layer has a concentration of cesium at a surface region that is higher than the concentration of cesium at an inside region.

12. A method according to claim 9 wherein (b) comprises:
(a) generating a laser beam having a first frequency;
(b) processing the laser beam to multiply the frequency of the laser beam to generate a laser beam having a second frequency; and
(c) directing the laser beam having the second frequency onto the photocathode.

13. A method according to claim 12 comprising doubling the frequency of the laser beam.

14. A method according to claim 12 wherein the first frequency corresponds to a wavelength of at least about 400 nm.

15. A method according to claim 9 comprising providing a photocathode wherein the activated cesium halide photoemissive layer comprises a surface concentration of cesium that is sufficiently high to reduce the electron work function at the surface to from about 2 to about 4 eV.

16. An apparatus according to claim 9 comprising providing a photocathode wherein the activated cesium halide photoemissive layer comprises a surface concentration of cesium that is sufficiently high to reduce the electron work function at the surface from about 7 to 8 eV in the conventional material, to about 2 eV in the activated material.

17. An electron beam pattern generator comprising:
(a) a diode-pumped or argon-ion laser source and a BBO crystal to generate a laser beam;
(b) a photocathode to receive the laser beam and generate an electron beam, the photocathode comprising an activated cesium bromide photoemissive layer having a thickness with a concentration gradient of cesium therethrough;
(c) electron optics to focus the electron beam onto a substrate; and
(d) a substrate support to support a substrate.

18. An apparatus according to claim 17 wherein the concentration of cesium at a surface region of the activated cesium bromide photoemissive layer is higher than the concentration of cesium at an inside region of the layer.

19. An apparatus according to claim 17 wherein the activated cesium bromide photoemissive layer comprises a surface concentration of cesium that is sufficiently high to reduce the electron work function at the surface to from about 2 to about 4 eV.

20. An apparatus according to claim 17 wherein the activated cesium bromide photoemissive layer comprises a surface concentration of cesium that is sufficiently high to reduce the electron work function at the surface from about 7 to 8 eV in the conventional material, to about 2 eV In the activated material.

21. An electron beam pattern generator comprising:
(a) a diode-pumped or argon-ion laser source and a BBO crystal to generate a laser beam;
(b) a photocathode to receive the laser beam and generate an electron beam, the photocathode comprising an activated cesium iodide photoemissive layer having a thickness with a concentration gradient of cesium therethrough;
(c) electron optics to focus the electron beam onto a substrate; and
(d) a substrate support to support the substrate.

22. An apparatus according to claim 21 wherein the concentration of cesium at a surface region of the activated cesium iodide photoemissive layer is higher than the concentration of cesium at an inside region of the layer.

23. An apparatus according to claim 21 wherein the activated cesium iodide photoemissive layer comprises a surface concentration of cesium that is sufficiently high to reduce the electron work function at the surface to from about 2 to about 4 eV.

24. An apparatus according to claim 21 wherein the activated cesium iodide photoemissive layer comprises a surface concentration of cesium that is sufficiently high to reduce the electron work function at the surface from about 7 to 8 eV in the conventional material, to about 2 eV in the activated material.

25. An electron beam pattern generator comprising:
(a) a laser beam generator to generate a laser beam;
(b) a photocathode to receive the laser beam and generate an electron beam, the photocathode comprising an activated cesium halide photoemissive layer having a thickness with a concentration gradient of cesium therethrough and a surface concentration of cesium that is sufficiently high to reduce the electron work function at the surface to from about 2 to about 4 eV;

(c) electron optics to focus the electron beam onto a substrate; and
(d) a substrate support to support the substrate.

26. An apparatus according to claim 25 wherein the activated cesium halide photoemissive layer comprises a surface concentration of cesium that is sufficiently high to reduce the electron work function at the surface from about 7 to 8 eV in the conventional material, to about 2 eV in the activated material.

27. An apparatus according to claim 25 wherein the activated cesium halide photoemissive layer comprises activated cesium bromide or activated cesium iodide.

28. An apparatus according to claim 25 wherein the surface concentration of cesium is higher than the concentration of cesium at an inside region of the layer.

29. An apparatus according to claim 25 wherein the activated cesium halide photoemissive layer provides a photoyield of greater than 200 nA/mW.

30. An apparatus according to claim 25 wherein the activated cesium halide photoemissive layer can be operated for at least about 150 hours without appreciable degradation.

31. An apparatus according to claim 25 wherein the laser beam generator comprises a diode-pumped or argon-ion laser source and a frequency multiplier crystal.

* * * * *